United States Patent [19]
Jiang et al.

[11] Patent Number: 5,757,836
[45] Date of Patent: May 26, 1998

[54] VERTICAL CAVITY SURFACE EMITTING LASER WITH LATERALLY INTEGRATED PHOTODETECTOR

[75] Inventors: Wenbin Jiang, Phoenix; Chan-Long Shieh, Paradise Valley; Michael S. Lebby, Apache Junction, all of Ariz.

[73] Assignee: Motorola, Inc., Schaumburg, Ill.

[21] Appl. No.: 673,488

[22] Filed: Jul. 1, 1996

[51] Int. Cl.⁶ .............. H01S 3/19; H01S 3/13; H01S 3/08
[52] U.S. Cl. .............. 372/50; 372/29; 372/96
[58] Field of Search .............. 372/29, 50, 96, 372/45, 46; 250/239; 257/85; 385/88; 369/121

[56] References Cited

U.S. PATENT DOCUMENTS

| | | | |
|---|---|---|---|
| 4,879,459 | 11/1989 | Negishi | 372/29 |
| 4,906,839 | 3/1990 | Lee | 250/239 |
| 5,345,462 | 9/1994 | Choquette | 372/96 |
| 5,491,712 | 2/1996 | Lin et al. | 372/50 |
| 5,568,502 | 10/1996 | Hironaka | 372/50 |
| 5,577,064 | 11/1996 | Swirhun et al. | 372/96 |
| 5,631,987 | 5/1997 | Lasky et al. | 385/88 |
| 5,663,944 | 9/1997 | Mun | 372/98 |

FOREIGN PATENT DOCUMENTS 5-299779  11/1993  Japan .............. 372/45

OTHER PUBLICATIONS

Neamen, Donald, Semiconductor Physics and Devices:Basic Principles, Illinois: Irwin, 1992, p. 628.

Primary Examiner—Rodney B. Bovernick
Assistant Examiner—Quyen Phan Leung
Attorney, Agent, or Firm—Eugene A. Parsons

[57] ABSTRACT

A vertical cavity surface emitting laser (VCSEL) having a first and a second mirror stack and an active region is formed utilizing epitaxial layer growth techniques. A lateral photodetector is integrally formed in the epitaxial growth layers, thereby providing for a VCSEL with laterally integrated photodetector. An isolation region is formed in the epitaxial growth layers between the VCSEL and the photodetector thereby isolating the VCSEL and the lateral photodetector. The integrated VCSEL and lateral photodetector capable of monitoring reflected laser emission, thus laser power output of the VCSEL and employing feedback to maintain a specific laser power output level, thereby capable of automatic power control (APC).

14 Claims, 3 Drawing Sheets

VERTICAL CAVITY SURFACE EMITTING LASER WITH LATERALLY INTEGRATED PHOTODETECTOR

FIELD OF THE INVENTION

This invention relates to vertical cavity surface emitting lasers and more specifically to monitoring and controlling the operation of vertical cavity surface emitting lasers.

BACKGROUND OF THE INVENTION

Semiconductor lasers, such as vertical cavity surface emitting lasers (VCSELs) and edge emitting lasers are well known, and are formed in a wide variety of configurations. The basis for VCSELs in virtually all configurations is an active area sandwiched between two mirror stacks. The laser is activated by driving an electrical current through the two mirror stacks and the active area. This is generally accomplished by placing a first electrode across the mirror stack at one end of the laser and a second electrode across the other mirror stack at the other end of the laser. One of the electrodes generally defines a central opening therethrough for the emission of light.

Automatic power control (APC) of light emitting devices, such as VCSELs, allows for these devices to sustain a constant and a consistent output. In general, automatic power control of edge emitting laser devices is easily achieved because edge emitting devices emit light from two ends. Thus, enabling one of the light emitting ends to be used to measure the power output, which is subsequently use to adjust the power input to the edge emitting device, thereby adjusting the power output.

However, automatic power control (APC) of a VCSEL is a difficult task because the VCSEL generally emits light from only a single surface, thus making measurement of the output, and subsequent adjustment thereof, a difficult task. Conventionally, in order to accomplish this task, several optical devices, such as photodiodes, mirrors, beam splitters, and the like are positioned manually in the optical path of the emission from the VCSEL. With the optical devices being positioned manually, several problems or disadvantages result, such as a high cost of manufacture, a lack of repeatability, and poor quality control, thus prohibiting high volume manufacturing.

It can be readily seen that conventional APC of VCSELs has several disadvantages and problems, thus not enabling their manufacture in volume manufacturing applications. Accordingly, an integrated VCSEL and photodetector and method for making the same that simplifies the fabrication process, reduces cost, and improves reliability would be highly advantageous.

Therefore, it would be highly advantageous to remedy the foregoing and other deficiencies inherent in the prior art. Accordingly, it is a purpose of the present invention to provide for an integrated VCSEL and photodetector.

It is a further purpose of the present invention to provide for an integrated VCSEL and photodetector, more specifically a photodiode, in which the photodiode is laterally formed in the epitaxial growth layers of the VCSEL.

It is yet another purpose of the present invention to provide for an integrated VCSEL and photodiode which solves alignment problems of the VCSEL and photodiode during manufacture.

It is a still further purpose of the present invention to provide for an integrated VCSEL and photodiode that is substantially simpler to assemble, amenable to high volume production and less costly to manufacture.

SUMMARY OF THE INVENTION

The above problems and others are substantially solved and the above purposes and others are realized in a semiconductor laser, such as a vertical cavity surface emitting laser (VCSEL), and laterally integrated photodetector, such as a photodiode, which serves to monitor the power output of the semiconductor laser. The laterally integrated photodetector is fabricated in and during the epitaxial growth of the plurality of layers which form the VCSEL. This monitoring of the output of the VCSEL allows for the employment of feedback to maintain consistent control of the VCSEL.

Furthermore, the above problems and others are substantially solved and the above purposes and others are realized in a method of forming a semiconductor laser, such as a vertical cavity surface emitting laser (VCSEL) and a laterally integrated photodetector including the steps of epitaxially fabricating a VCSEL, and utilizing a defining isolation device, such as a proton implant and/or isolation trench to fabricate and define a laterally positioned photodetector utilizing the same epitaxial growth layers as the VCSEL.

BRIEF DESCRIPTION OF THE DRAWINGS

Referring to the drawings.

DESCRIPTION OF THE PREFERRED EMBODIMENT

Figure 1:
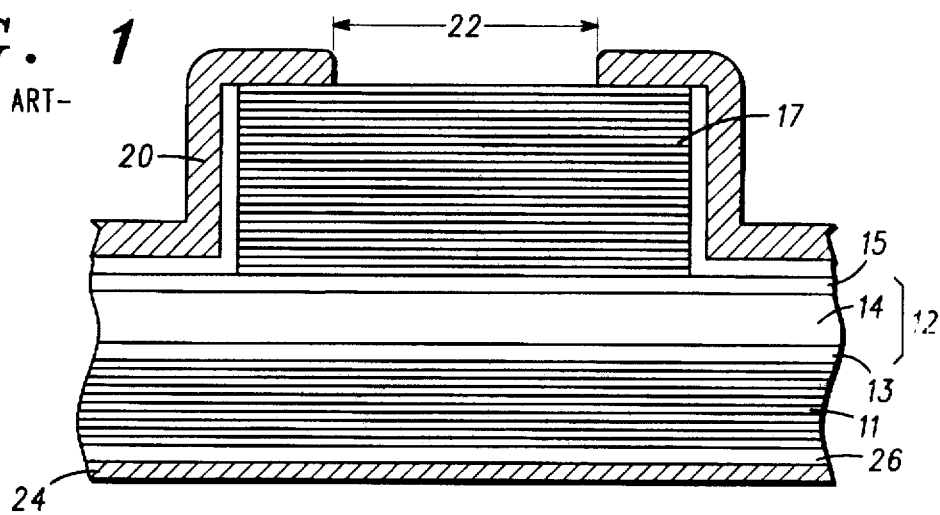
FIG. 1 is a partial sectional view of a conventional vertical cavity surface emitting laser.

Turning now to the drawings attention is first directed to FIG. 1 which illustrates a vertical cavity surface emitting laser (VCSEL) generally designated 10, as is well known in the art, and designated prior art 10. VCSEL 10 includes a first mirror stack 11, an active region 12 having a first cladding layer 13, an active layer 14, (such as one or more quantum wells and the like) and a second cladding layer 15, and a second mirror stack 17, thereby defining an optical pathway through which light is generated and passes. Second mirror stack 17 is etched, or selectively deposited to form a mesa-like or ridge-like structure. An alternative embodiment employing a planar VCSEL structure is anticipated by this disclosure and typically fabricated in a similar manner, having proton implants included within the first mirror stack to define an electrical current pathway for the emission of light from the planar VCSEL. This provision for the proton implants corresponds to the etching or selective deposition of second mirror stack 17 in the above-described mesa-like structure.

An electrical contact 20 is formed in contact with at least the upper end of second mirror stack 17. Electrical contact 20 defines a window 22 for the emission of light from VCSEL 10 through second mirror stack 17. A second electrical contact 24 is positioned over the lower surface of first mirror stack 11, typically on the opposing surface of a substrate 26 upon which the device is formed.

An operating voltage applied across contacts 20 and 24 produces a current flow through VCSEL 10 which produces the lasing action as is well known. In general, because of the position of electrical contact 20 on the surface of second mirror stack 17, current flows throughout the mesa-like structure of second mirror stack 17 and lasing is supported wherever current flows. Since current outside the optical mode is wasted and may even interfere with proper operation of the VCSEL, typically, the diametric size of the mesa (and the emission area defined by the proton implants of the planar VCSEL structure) is dependent upon the mode of operation of the VCSEL, with the diameter closely matching the mode of operation. In this manner, current flow is generally limited to the mode of operation.

Figure 2:
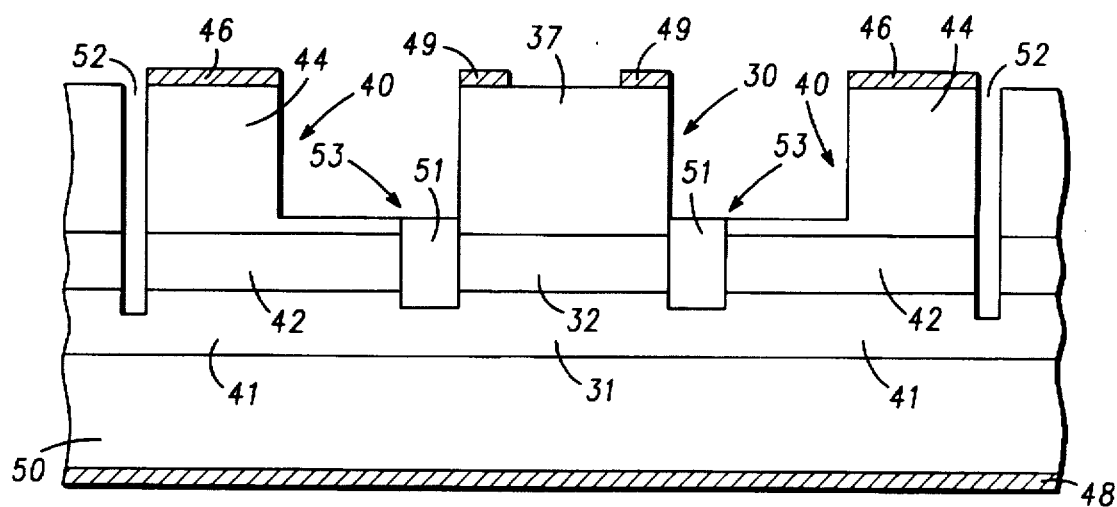
FIG. 2 is a partial sectional view of a conventional mesa-like VCSEL and a laterally integrated photodetector in accordance with the present invention.
Figure 3:
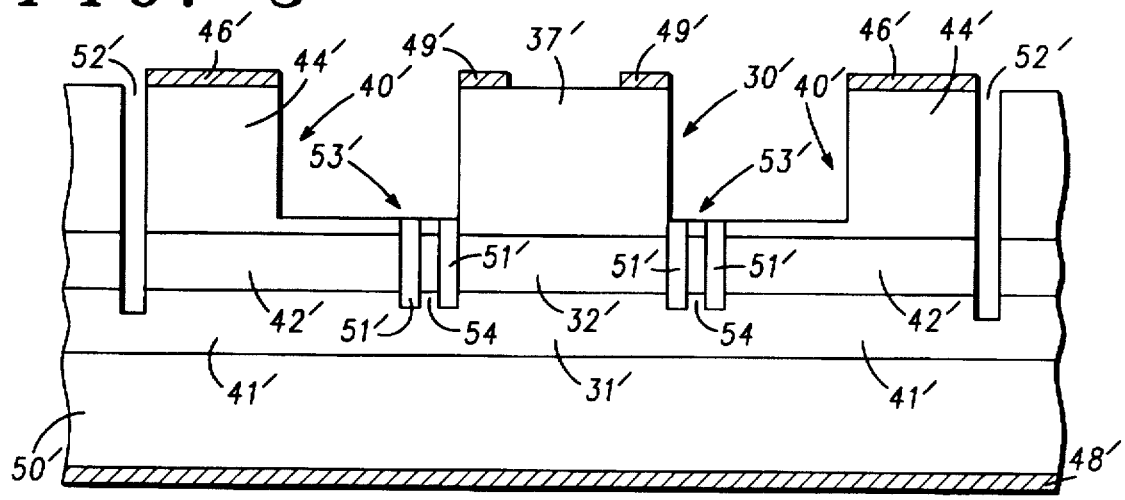
FIG. 3 is a partial sectional view of a mesa-like VCSEL and a laterally integrated photodetector in accordance with a second embodiment of the mesa-like VCSEL of the present invention.
Figure 4:
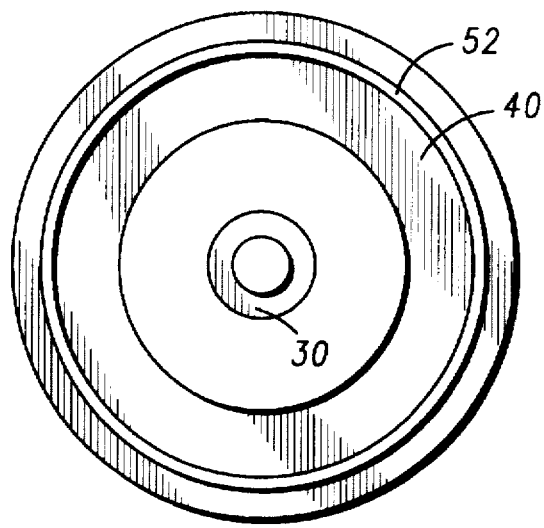
FIG. 4 is a simplified top plan view of one embodiment of the structure of FIG. 2.
Figure 5:
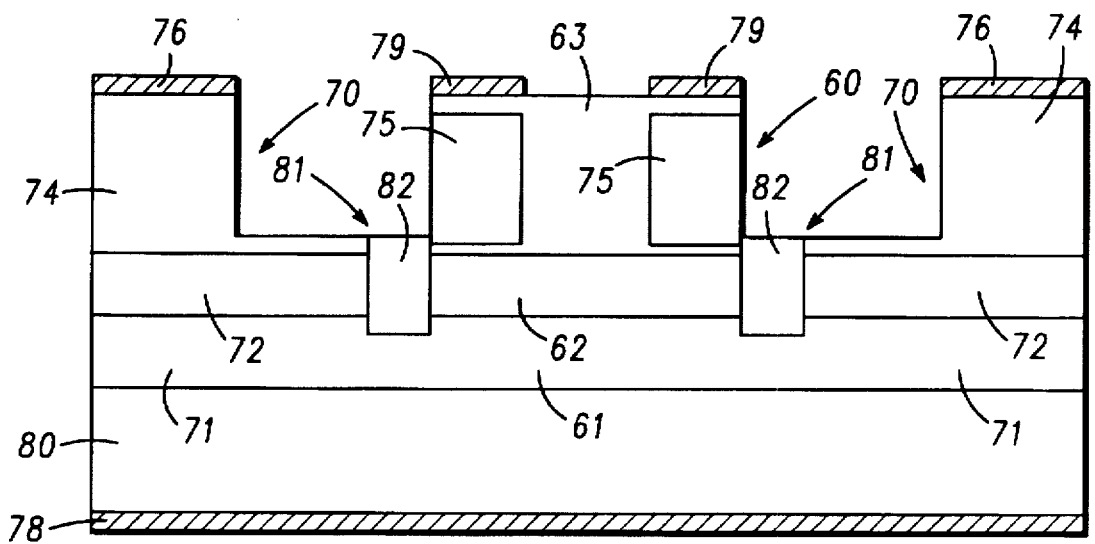
FIG. 5 is a partial sectional view of a planar VCSEL and a laterally integrated photodetector in accordance with the present invention.
Figure 6:
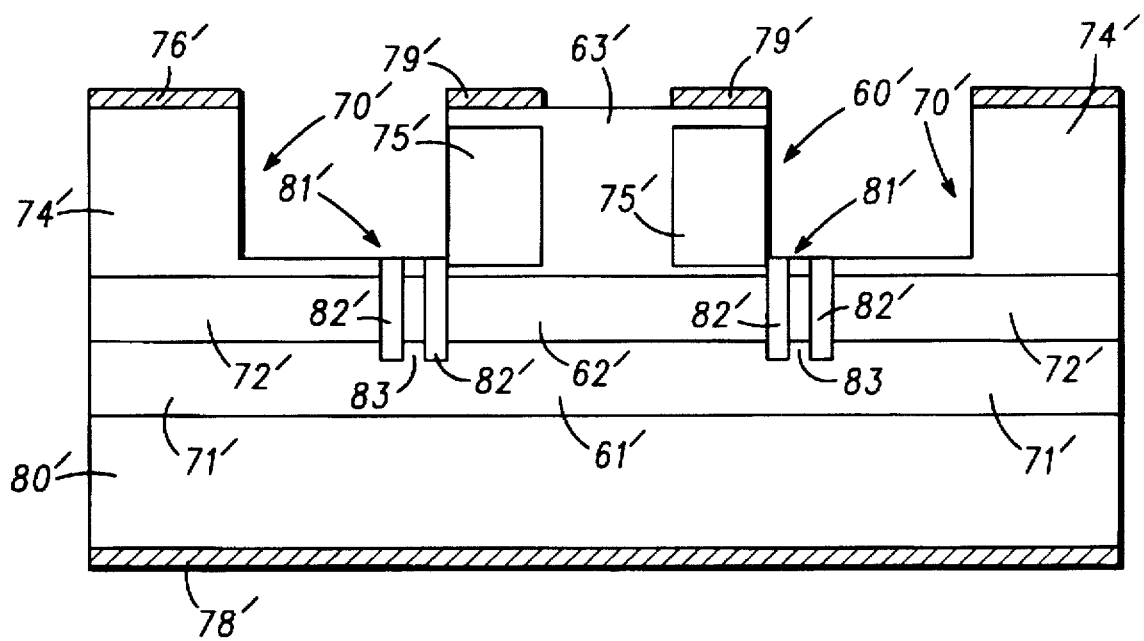
FIG. 6 is a partial sectional view of a planar VCSEL and a laterally integrated photodetector in accordance with a second embodiment of the planar VCSEL of the present invention.

Referring now to FIGS. 2–6, it should be noted that in FIGS. 2–4, the VCSEL device is represented by a ridge-like or mesa-like VCSEL 30 and in FIGS. 5 and 6 the VCSEL device is represented by a planar VCSEL 60. Turning now to FIG. 2, a mesa-like vertical cavity surface emitting laser 30 (VCSEL) embodying the present invention is illustrated. VCSEL 30 includes a first mirror stack 31, an active region 32, and a second mirror stack 37. Second mirror stack 37 is etched, or selectively deposited to form a mesa-like structure, as described above. Alternatively, VCSEL 30 is formed into a mesa-like structure by any suitable well-known method in the art, such as photolithography, etching, lift-off, any combination thereof, or the like. By defining the mesa-like structure in the second mirror stack 37, an optical path is defined in the second mirror stack 37 that reflects and guides light formed in active region or area 32.

A lateral photodetector 40 is formed around or adjacent VCSEL 30 and includes a first mirror stack 41, corresponding to first mirror stack 31, an active region 42, corresponding to active region 32, and a second mirror stack 44 corresponding to second mirror stack 37. In this embodiment, lateral photodetector 40 is integrated with VCSEL 30, and formed at the same time, i.e. first mirror stack 41, active region 42, and second mirror stack 44 are generally identical with first mirror stack 31, active region 32 and second mirror stack 37. An electrical contact 46 is formed in contact with at least the upper end of second mirror stack 44 of photodetector 40 and an electrical contact 49 is formed in contact with at least the upper end of second mirror stack 37 of VCSEL 30 fabricated so as to define an emitting area for VCSEL 30. A second electrical contact 48 is positioned over the lower surface of a substrate 50 (described presently). Photodetector 40 is isolated from VCSEL 30 by an isolation region 53, more specifically by either etching, isolation trenches, or a proton implant 51 formed around or adjacent VCSEL 30. Proton implant 51 provides for the blocking and/or absorption of lateral current spreading from VCSEL 30, thereby defining and isolating photodetector 40 from VCSEL 30. There are optionally provided further isolation trenches 52 to further define photodetector 40.

Alternatively, and as illustrated in FIG. 3, there is provided a plurality of spaced apart proton implants 51', thereby defining a region 54 between proton implant 51'. It should be noted that all components similar to the components illustrated in FIG. 2, are designated with similar numbers, having a prime added to indicate the different embodiment. As illustrated, defined region 54 serves to further isolate VCSEL 30' from lateral photodetector 40' during operation. More specifically, defined region 54 acts as an absorption area between the two active devices 30' and 40', absorbing lateral spontaneous emission from VCSEL 30'.

Referring now to FIG. 4, illustrated in simplified top view is the preferred integrated VCSEL 30 and photodetector 40 of the present invention. As illustrated, in the preferred embodiment integrated VCSEL 30 and photodetector 40 are formed in a substantially ring-like structure, thereby providing for the incorporation of VCSEL 30 and photodetector 40 within a standard TO can, and for the lateral detection of reflected laser emission emitted by VCSEL 30 by photodetector 40. Alternatively, the VCSEL and laterally integrated photodetector of the present invention can be formed in any number of substantially geometric structures. More specifically the VCSEL and laterally integrated photodetector of the present invention can be formed as a substantially rectangular or square-like structure wherein the photodetector is formed around or adjacent the VCSEL structure, having positioned therebetween an isolation region for the blocking and/or absorption of lateral current spreading and/or lateral spontaneous laser emissions. It should further be understood that the photodetector and the isolation region of the present invention do not have to be symmetrically positioned around or adjacent the VCSEL structure. This allowance for an asymmetrical structure allows for the increasing or decreasing of the actual region which detects and/or receives the reflected laser emissions.

Referring now to FIGS. 5 and 6, illustrated are alternative embodiments of a planar vertical cavity surface emitting laser according to the present invention, designated 60 and 60'. With reference to FIG. 5, VCSEL 60 includes a first mirror stack 61, an active region 62, and a second mirror stack 63. Second mirror stack 63 is deposited in a substantially planar manner to form a planar-like structure. A lateral photodetector 70 is formed around or adjacent VCSEL 60 and includes a first mirror stack 71, corresponding to first mirror stack 61, an active region 72, corresponding to active region 62, and a second mirror stack 74 corresponding to second mirror stack 63. As in the previously described mesa-like VCSEL 30, lateral photodetector 70 is integrated with VCSEL 60, and formed at the same time, i.e. first mirror stack 71, active region 72, and second mirror stack 74 are generally identical with first mirror stack 61, active region 62 and second mirror stack 63. There are provided a plurality of proton implants 75 to further define the active light emitting region of VCSEL 60, fabricated as is well known in the art. An electrical contact 76 is formed in contact with at least the upper end of second mirror stack 74 of photodetector 70 and an electrical contact 79 is formed in contact with at least the upper end of second mirror stack 63 of VCSEL 60. A second electrical contact 78 is positioned over the lower surface of substrate 80 (discussed presently). Photodetector 70 is isolated from VCSEL 60 by an isolation region 81, more specifically either formed by etching, isolation trenches, and/or the utilization of a proton implant 82 formed around or adjacent VCSEL 60. As illustrated, a trench-like structure is formed between planar VCSEL 60 and photodetector 70, thereby providing for the insertion of proton implant 82. As previously described, proton implant 82 serves to block lateral current spreading between VCSEL 60 and photodetector 70, thereby further defining and isolating photodetector 70. There are optionally provided further isolation trenches (not shown) as previously described with reference to FIGS. 2 and 3, to further define photodetector 70.

Alternatively, and as illustrated in FIG. 6, there may be provided a plurality of proton implants 82', formed around or adjacent VCSEL 60', thereby defining a region 83 formed between proton implants 82'. It should be noted that all components similar to the components illustrated in FIG. 5, are designated with similar numbers, having a prime added to indicate the different embodiment. As illustrated, defined region 83 serves to further isolate VCSEL 60' from lateral photodetector 70' during operation. More specifically, defined region 83 acts as an additional absorption layer between the two active devices 60' and 70', serving to absorb lateral spontaneous emission emitted by VCSEL 60', prior to reaching photodetector 70'.

It should be understood that FIGS. 1–6 are simplified illustrations and that many elements have been purposefully omitted to more clearly illustrate the present invention. Generally, as shown in FIGS. 1–6, both mesa-like VCSEL 30 and 30' and planar VCSEL 60 and 60' are made by any well-known method or process in the art. However, for the purposes of orienting the reader, a brief description of materials and methods is provided hereinbelow. Briefly, both mesa-like VCSEL 30 and planar VCSEL 60 are fabricated on any suitable semiconductor substrate, such as gallium arsenide, indium phosphide, or the like. First mirror stacks 31 and 41 of FIGS. 2 and 3 and 61 and 71 of FIGS. 5 and 6 are formed of distributed Bragg reflectors, active areas 32 and 42 of FIGS. 2 and 3, and 62 and 72 of FIGS. 5 and 6 are formed of GaAs quantum wells with AlGaAs cladding, and the second stack of mirrors 37 and 44 of FIGS. 2 and 3, and 63 and 74 of FIGS. 5 and 6 are formed of distributed Bragg reflectors that are epitaxially deposited on the surface of active regions 32 and 42 of FIGS. 2 and 3, and 62 and 72 of FIGS. 5 and 6, by any suitable method, such as molecular beam epitaxy (MBE), meto-organic chemical vapor deposition (MOCVD), or the like.

Once ridge VCSEL 30 or planar VCSEL 60 have been formed, a series of depositions and patterning steps are performed to further fabricate the disclosed layers and implantations. Generally, the depositions are performed by any suitable well-known method in the art such as chemical vapor deposition (CVD), plasma enhanced chemical vapor deposition (PECVD), sputtering, or the like. In addition, the pattering and implantation steps also are performed by any suitable well-known methods or processes in the art, such as photolithography, lift-off, etching, or combination thereof.

During operation, VCSEL 30 or 60 generates a laser emission of which automatic power control (APC), as previously described, is sought. Accordingly, the structure when packaged within a standard TO-series can, is capable of APC. The can generally is fabricated having formed an angled upper portion, through which the laser emission exits, a portion being reflected back to lateral photodetector 40 or 70 which is reverse biased, or alternatively is without bias, to act as detector. This reflection back and reverse biasing of the photodetector results in either an increase or decrease in the drive current, in that the laser emission is defined as being a function of the drive current.

Figure 7:
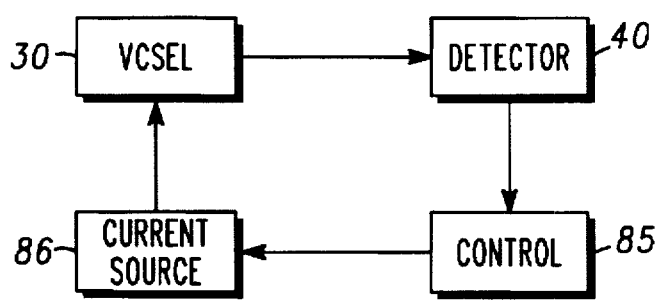
FIG. 7 is a simplified block diagram of a feedback control system.

Turning now to FIG. 7, illustrative of the operation of the integrated VCSEL and lateral photodetector of the present invention, the laser power of VCSEL 30 is controlled by employing a feedback system. A control device 85 receives and processes the information monitored by lateral photodetector 40. More specifically, the laser power output, based upon the specific laser power detected by monitoring the reflected laser emission of VCSEL 30. This processing of the information monitored by photodetector 40 allows for the identification of a point at which a change in laser power is detected, thereby providing for automatic regulation of the current employed to drive VCSEL 30 from a current source 86. Thus, knowledge of the laser power at which the laser light is emitted, allows for automatic power control (APC) based on feedback, thereby maintaining operation of the laser at a specific, constant laser power output.

Thus, a semiconductor laser, more specifically a vertical cavity surface emitting laser (VCSEL), having a laterally integrated photodetector formed therewith and a method of monitoring the power output of the VCSEL utilizing the lateral photodetector has been provided. More specifically, there is provided a VCSEL that is now integrated with a laterally fabricated photodetector, thereby enabling the laser power output of the VCSEL to be easily monitored and subsequently automatically adjusted to a desired constant level. Additionally, since an integrated VCSEL and photodetector are fabricated as one device, the result is a highly manufacturable device, thus reducing cost and allowing significant improvements in reliability and quality.

While we have shown and described specific embodiments of the present invention, further modification and improvement will occur to those skilled in the art. We desire it to be understood, therefore, that this invention is not limited to the particular forms shown and we intend in the appended claims to cover all modification that do not depart from the spirit and scope of this invention.

What is claimed is:

1. A vertical cavity surface emitting laser with a laterally integrated photodetector comprising:

a vertical cavity surface emitting laser having a substrate with a first surface, a first mirror stack disposed on the first surface, an active region disposed on the first mirror stack, a second mirror stack disposed on the active region so as to define an optical pathway through which light is generated and passes, the vertical cavity surface emitting laser further including first and second electrical contacts coupled to the first and second mirror stacks respectively for supplying operating power thereto;

a laterally integrated photodetector having a substrate with a first surface, a first mirror stack disposed on the first surface of the substrate, an active region disposed on the first mirror stack, a second mirror stack disposed on the active region so as to define a device characterized as detecting a reflected laser emission emitted by the vertical cavity surface emitting laser, the laterally integrated photodetector further including first and second electrical contacts coupled to the first and second mirror stacks respectively for supplying operating power thereto; and an isolation region disposed within the first mirror stack, the active region, and the second mirror stack, the isolation region positioned between the vertical cavity surface emitting laser and the laterally integrated photodetector so as to block lateral current spreading between the vertical cavity surface emitting laser and the laterally integrated photodetector.

2. A vertical cavity surface emitting laser with a laterally integrated photodetector as claimed in claim 1 wherein the substrate, the active region, and the first and second mirror stacks of the vertical cavity surface emitting laser are the same as the substrate, the active region, and the first and second mirror stacks of the laterally integrated photodetector.

3. A vertical cavity surface emitting laser with a laterally integrated photodetector as claimed in claim 1 wherein the isolation region is formed by at least one proton implant.

4. A vertical cavity surface emitting laser with a laterally integrated photodetector as claimed in claim 3 wherein the isolation region is formed by at least two spaced apart proton implants, thereby defining a lateral spontaneous emission absorbing region therebetween.

5. A vertical cavity surface emitting laser with a laterally integrated photodetector as claimed in claim 1 wherein the isolation region is formed by an isolation trench.

6. A vertical cavity surface emitting laser with a laterally integrated photodetector as claimed in claim 1 wherein the laterally integrated photodetector is one of reversed biased and without bias.

7. A vertical cavity surface emitting laser with a laterally integrated photodetector comprising:

a vertical cavity surface emitting laser having a substrate with a first surface, a first mirror stack disposed on the first surface, an active region disposed on the first mirror stack, a second mirror stack disposed on the active region so as to define an optical pathway through which light is generated and passes, the vertical cavity surface emitting laser further including first and second electrical contacts coupled to the first and second mirror stacks respectively for supplying operating power thereto;

a laterally integrated photodetector having a substrate with a first surface, a first mirror stack disposed on the first surface of the substrate, an active region disposed on the first mirror stack, a second mirror stack disposed on the active region so as to define an area capable of detecting reflected laser emission emitted by the vertical cavity surface emitting laser, the laterally integrated photodetector further including first and second electrical contacts coupled to the first and second mirror stacks respectively for supplying operating power thereto; and an isolation region, including a plurality of proton implants having a region defined therebetween for lateral spontaneous laser emission absorption disposed within the first mirror stack, the active region, and the second mirror stack, the plurality of proton implants being positioned between the vertical cavity surface emitting laser and the laterally integrated photodetector so as to block lateral current spreading between the vertical cavity surface emitting laser and the laterally integrated photodetector.

8. A vertical cavity surface emitting laser with a laterally integrated photodetector as claimed in claim 7 wherein the structure of the vertical cavity surface emitting laser, the laterally integrated photodetector and the isolation region is formed in a ring-like structure.

9. A vertical cavity surface emitting laser with a laterally integrated photodetector as claimed in claim 7 wherein the vertical cavity surface emitting laser and the laterally integrated photodetector share a common substrate, common active region and common first and second mirror stacks.

10. A vertical cavity surface emitting laser with a laterally integrated photodetector as claimed in claim 7 wherein the vertical cavity surface emitting laser is a mesa-like structure.

11. A vertical cavity surface emitting laser with a laterally integrated photodetector as claimed in claim 7 wherein the vertical cavity surface emitting laser is a planar structure.

12. A vertical cavity surface emitting laser with a laterally integrated photodetector as claimed in claim 11 wherein the planar structure includes at least one proton implant defining an electrical current pathway through which laser emission is directed.

13. A method of fabricating a vertical cavity surface emitting laser with an integrated photodetector comprising the steps of:

forming a vertical cavity surface emitting laser having a substrate with a first surface, a first mirror stack disposed on the first surface of the substrate, and active region disposed on the first mirror stack, a second mirror stack disposed on the active region so as to define an optical pathway through which light is generated and passes, providing the vertical cavity surface emitting laser with first and second electrical contacts coupled to the first and second mirror stacks respectively for supply operating power thereto;

forming a laterally integrated photodetector having a substrate with a first surface, a first mirror stack disposed on the first surface of the substrate, an active region disposed on the first mirror stack, a second mirror stack disposed on the active region so as to define a device characterized as detecting reflected laser emission emitted by the vertical cavity surface emitting laser, the laterally integrated photodetector further including first and second electrical contacts coupled to the first and second mirror stacks respectively for supplying operating power thereto; and providing an isolation region formed within the first mirror stack, the active region, and the second mirror stack, the isolation region being positioned between the vertical cavity surface emitting laser and the laterally integrated photodetector so as to block lateral current spreading between the vertical cavity surface emitting laser and the laterally integrated photodetector, the step of providing an isolation region further including the formation of two proton implants, thereby defining a region therebetween for lateral spontaneous laser emission absorption.

14. A method of fabricating a vertical cavity surface emitting laser with an integrated photodetector as claimed in claim 13 wherein the step of providing an isolation region includes formation of an isolation trench.

* * * * *